United States Patent [19]

Schiller

[11] Patent Number: 4,593,411
[45] Date of Patent: Jun. 3, 1986

[54] DIODE MIXER WITH BIAS CONTROL

[76] Inventor: Wolfgang Schiller, Bismarckstrasse 22, D-7100 Heilbronn, Fed. Rep. of Germany

[21] Appl. No.: 589,001

[22] Filed: Mar. 13, 1984

[30] Foreign Application Priority Data

Mar. 16, 1983 [DE] Fed. Rep. of Germany ....... 3309399

[51] Int. Cl.⁴ .......................... H04B 1/16; H04B 1/26
[52] U.S. Cl. .................................... 455/109; 455/118; 455/183; 455/185; 455/323; 455/330; 455/332
[58] Field of Search ................ 455/47, 109, 112, 118, 455/119, 180, 183, 185, 186, 313, 323, 330, 331, 332; 375/39, 43, 51; 332/45, 43 B

[56] References Cited

U.S. PATENT DOCUMENTS

| 2,425,454 | 8/1947 | Bloch . | |
|---|---|---|---|
| 3,855,533 | 12/1974 | Schueli | 375/39 |
| 3,868,601 | 2/1975 | MacAfee | 375/61 |
| 4,293,825 | 10/1981 | Cerra | 455/181 |
| 4,346,479 | 8/1982 | Weber | 455/313 |

FOREIGN PATENT DOCUMENTS

| 0044156 | 1/1982 | European Pat. Off. . |
| 0046835 | 3/1982 | European Pat. Off. . |
| 2047909 | 3/1972 | Fed. Rep. of Germany . |
| 2814577 | 10/1979 | Fed. Rep. of Germany . |
| 2834231 | 2/1980 | Fed. Rep. of Germany . |
| 412024 | 11/1966 | Switzerland . |

OTHER PUBLICATIONS

Microwave Magazine, vol. 8, No. 6, Dec. 82, Bert C. Henderson; pp. 718–725.

Primary Examiner—Jin F. Ng

[57] ABSTRACT

A diode mixer arrangement including a mixer stage connected for receiving a signal having a frequency to be converted and an oscillator signal having one of a plurality of preselectable oscillator frequencies. The mixer stage includes diodes arranged to be biased by a predetermined direct control voltage for the compensation of parasitic influences. A voltage branch is connected to the mixer stage for producing the predetermined direct control voltage. The voltage branch includes a memory device for storing a plurality of data signals each of which represents a predetermined direct control voltage corresponding to a respective one of the plurality of preselectable oscillator frequencies. The memory device has an input for receiving an input signal which represents the preselectable oscillator frequency of the oscillator signal received by the mixer stage and an output for reading out the corresponding data signal which is used by the voltage branch to generate the predetermined direct control voltage.

5 Claims, 5 Drawing Figures

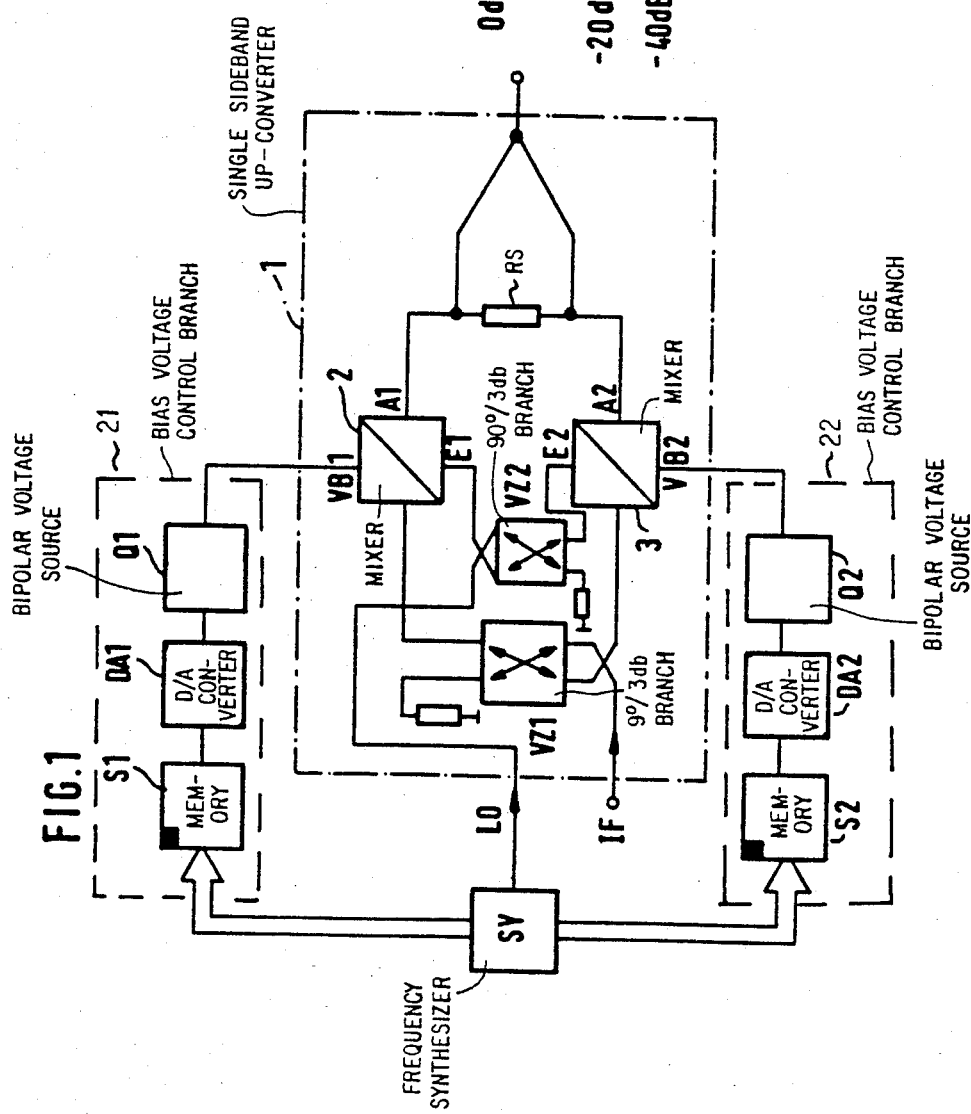

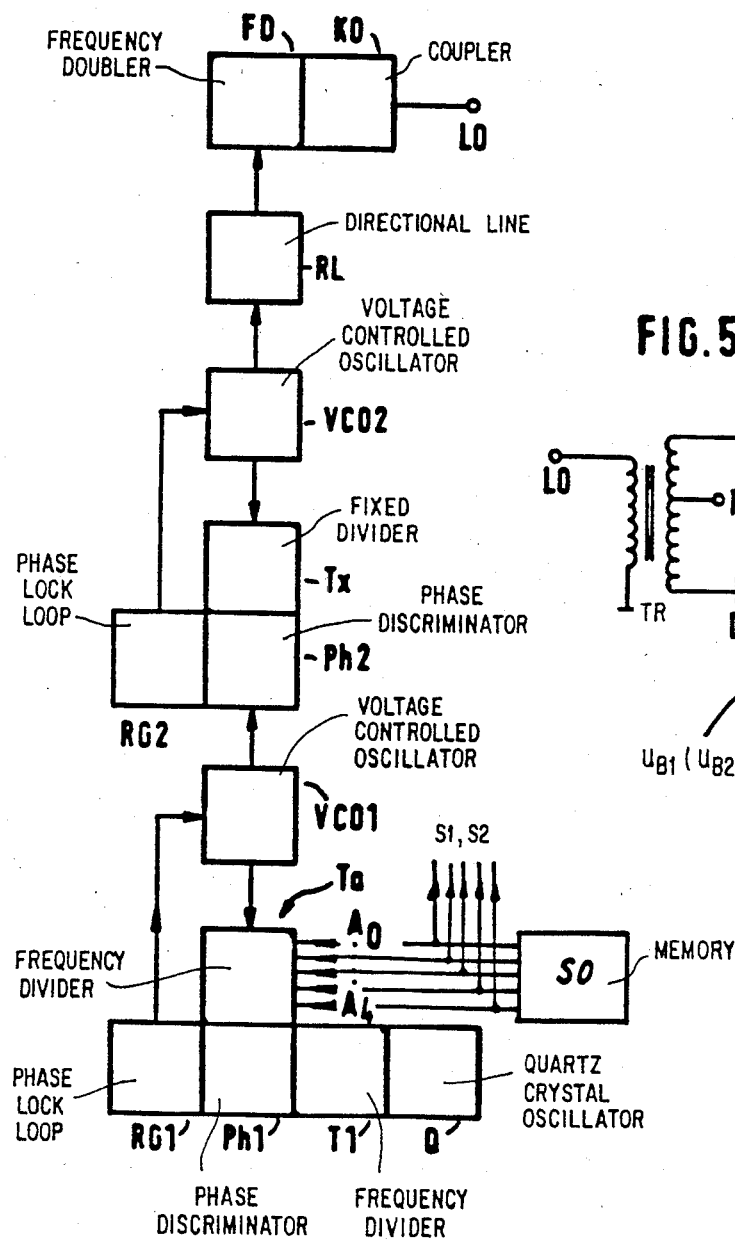
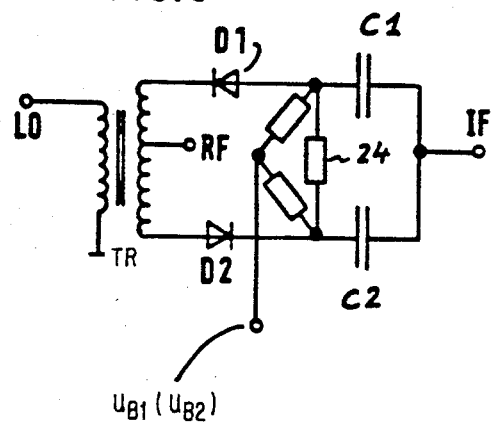

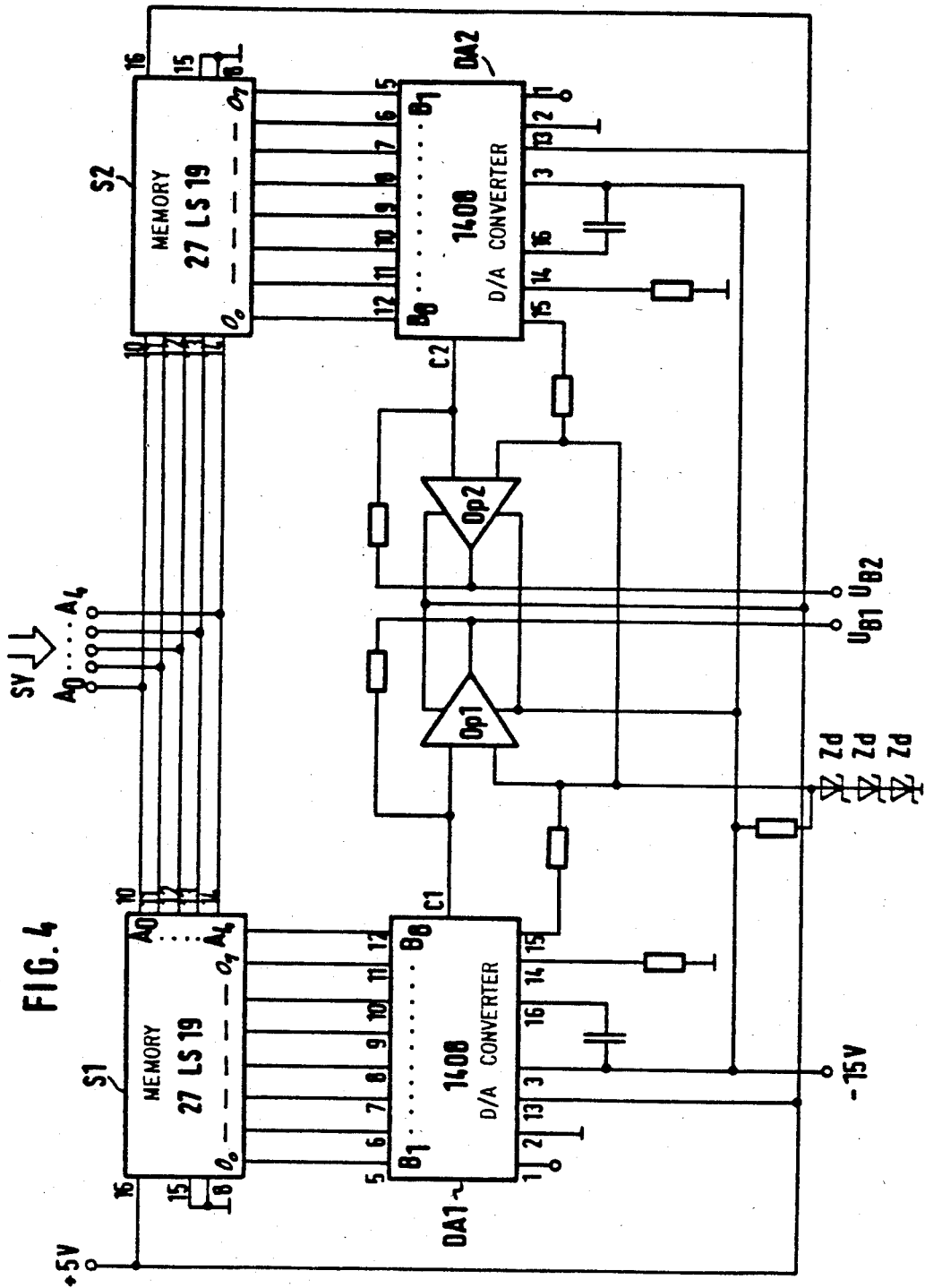

DIODE MIXER WITH BIAS CONTROL

BACKGROUND OF THE INVENTION

The present invention relates to a diode mixer having at least one mixer stage which receives a signal having a frequency to be converted and an oscillator signal having a preselectable oscillator frequency, wherein the mixer stage has mixer diodes arranged to be biased by a direct control voltage for the compensation of parasitic influences.

The periodical Microwave Magazine, volume 8, No. 6, 1982, page 720, discloses a mixer circuit in which direct control voltages are fed to mixer diodes in the mixer stages. With such a direct control voltage it is possible to equalize parasitic influences during the mixing process.

European Patent Application No. 44,156-A1 discloses the principle of feeding an oscillator signal derived from a frequency synthesizer to single sideband mixers.

When changing to another transmission channE1, i.e. when changing the oscillator signal, the problem arises of having to correspondingly change the biases across the mixer diodes of the mixer stages.

SUMMARY OF THE INVENTION

It is therefore an object of the present invention to design a diode mixer of the type having a mixer stage including diodes which receive direct control voltages wherein when there is a change in oscillator frequency, a suitable direct control voltage will always be available for the mixer diodes.

The above and other objects are accomplished according to the invention wherein a diode mixer arrangement is provided which includes a mixer stage connected for receiving a signal having a frequency to be converted and an oscillator signal having one of a plurality of preselectable oscillator frequencies. The mixer stage includes diodes arranged to be biased by a predetermined direct control voltage for the compensation of parasitic influences. Voltage means are connected to the mixer stage for producing the predetermined direct control voltage. The voltage means includes a memory means for storing a plurality of data signals each of which represents a predetermined direct control voltage corresponding to a respective one of the plurality of preselectable oscillator frequencies. The memory means has an input for receiving an input signal which represents the preselectable oscillator frequency of the oscillator signal received by the mixer stage and output means for reading out the corresponding data signal which is used by the voltage means to generate the predetermined direct control voltage.

Because the bias across the mixer diodes of each mixer stage is individually set relative to respective oscillator frequencies, the present invention results in an improvement of symmetry characteristics. As a result of the invention, oscillator frequency suppression may take on very high values, for example up to 40 dB particularly if the mixer is used as a single sideband mixer. The solution provided by the present invention results in more than doubling the usable bandwidth, depending on the required mixer temperature range. The mixer according to the present invention can easily be made to be remotely controllable, since readjustment of the bias is no longer necessary with a change of oscillator frequency. Moreover, matching of the bias associated with each oscillator frequency can be easily accomplished.

BRIEF DESCRIPTION OF THE DRAWINGS

FIG. 1 is a block circuit diagram of a single sideband mixer according to the invention.

FIG. 2 is a diagram showing the output energy spectrum versus frequency of the single sideband mixer of FIG. 1.

FIG. 3 is a block circuit diagram of the frequency synthesizer shown in FIG. 1.

FIG. 4 is a block circuit diagram of the bias voltage control branches shown in FIG. 1.

FIG. 5 is a block circuit diagram for the mixer stages of FIG. 1.

DESCRIPTION OF THE PREFERRED EMBODIMENT

FIG. 1 shows a broadband single sideband up-converter 1 with electronically controlled carrier suppression for the transmission of 16 QAM signals in the gigahertz range. The up-converter 1 includes two mixer stages 2 and 3 which receive an intermediate frequency signal IF through a conventional 90°/3 dB branch vZ1. A preselectable oscillator frequency LO for up-converting the intermediate frequency IF into a radio frequency RF is generated by a frequency synthesizer SY and fed at the same frequency to inputs E1 and E2 of mixer stages 2 and 3 through a further conventional 90°/3 dB branch vZ2.

Synthesizer SY has digital address outputs which are connected with memory devices S1 and S2 of bias voltage control branches 21 and 23, respectively. Memory devices S1 and S2 each store digital words associated with each preselectable oscillator frequency LO. Voltage control branches 21 and 22 further include dititalal/analog converters DA1 and DA2 respectively, which convert the digital words stored in memory devices S1 and S2 into analog values which are used to control bipolar voltage sources Q1 and Q2 whose outputs are connected to respective control inputs vB1 and vB2 of mixer stages 2 and 3, respectively.

By direct voltage controlling mixer stages 2 and 3 respectively, the symmetry of the mixer stages can be improved, which results in an improvement of carrier suppression. If there is a change in oscillator frequency, the bias for the mixer stages 2 and 3 is automatically changed as well. The up-converted radio frequency signals RF present at outputs A1 and A2 of the mixer states 2 and 3, respectively, are combined by means of a suitable summing member such as resistor RS. Image frequencies are absorbed in resistor RS.

The previously customary filtering out of radio frequency RF can be therefore be omitted.

FIG. 2 shows the output spectrum of the single sideband converter. The upper sideband is marked USB and the lower sideband is marked LSB. The oscillator frequency, i.e. the carrier, is marked LO. As can be seen in FIG. 2, carrier suppression with respect to USB is 40 dB.

FIG. 3 shows the basic configuration of an exemplary synthesizer SY which can be used in the circuit of FIG. 1. The output signal of a first voltage controlled oscillator VCO1 is divided down by means of an addressable frequency divider $T_a$, as is the output signal from quartz oscillator Q, and these signals are returned to VCO1 via a phase discriminator Ph1 and a phase locked loop RG1. The adressable frequency divider $T_a$ is controlled via adress inputs $A_0$ to $A_4$ by an additional memory PROM SO in which the information for every possible preselectable oscillator frequency LO is stored in digital form. The output frequency of VCO1 may be, for example, 250 kHz. The VCO1 is followed by a second voltage controlled oscillator VCO2 whose output is compared via a fixed divider Tx in a phase discriminator Ph2 with the output frequency of the VCO1. The output of VCO2 is regulated via the phase locked loop RG2. The VCO2 furnishes an output frequency, for example, of 2 GHz. The oscillator frequency LO is obtained through a directional line RL, a frequency doubling stage FD and a coupler KO.

FIG. 4 shows the bias voltage control branches 21 and 22 in greater detail. The address inputs $A_0$ to $A_4$ of frequency divider $T_a$ are additionally fed as inputs to PROM memories S1 and S2 to feed bias voltage control branches. The address output of PROM SO of the synthesizer SY is a five-bit digital word which is unique for each possible oscillator frequency LO. That is, it changes only if the channel is changed. In the illustrated embodiment, the five-bit address can produce 32 possible digital words which correspond to 32 different channels. The digital word address is statically fed in parallel to each of PROMs S1 and S2. For every possible digital word, PROM S1 and S2 each generate an eight-bit output signal, likewise static and in parallel. Output signals $O_0$ to $O_7$ of each PROM, S1 and S2, reach the inputs $B_1$ to $B_8$ of digital to analog (D/A) converters DA1 and DA2 and are there converted to direct voltages. These direct voltages are available at outputs $C_1$ and $C_2$ of the D/A converters DA1 and DA2, respectively. The PROMs S0, S1 and S2 may be integrated circuits generally known by the nomenclature 27 LS 19—Advanced Micro Devices—and the D/A converters may be those generally known by the nomenclature 1408—Motorola. PROMs comprising memories S1 and S2 may alternatively be in the form of E-PROMs.

A push-pull mixer stage requires one PROM. A single sideband converter requires two PROMs since it includes two push-pull mixer stages.

As shown in FIG. 1 the outputs of the D/A converters DA1 and DA2 are each connected with a respective one of bipolar voltage sources Q1 and Q2. In FIG. 4 the bipolar voltage sources are realized by operational amplifiers Op1 and Op2. Outputs $C_1$ and $C_2$ of DA1 and DA2, respectively, are each connected to the respective inverting inputs of Op1 and Op2. The noninverting inputs of Op1 and Op2 are connected to a reference voltage which is obtained via the series connection of three Zener diodes Zd. Output $U_{B1}$ of operational amplifier Op1 is connected with mixer stage 2 via the input vB1, and output $U_{B2}$ of operational amplifier Op2 is connected with mixer stage 3 via input VB2.

The basic design of mixer stages 2 and 3, which are of identical construction, is shown in FIG. 5. Oscillator frequency LO is fed into the primary side of a transformer TR. The winding ends of the secondary winding of transformer TR are connected with mixer diodes D1 and D2, namely one secondary end winding with the cathode of D1 and the other secondary winding end with the anode of D2. The ends of the mixer diodes D1 and D2 facing away from transformer TR are connected together via direct voltage separating capacitors C1 and C2. The frequency IF to be converted is fed in at the connection point of C1 and C2. A respective one of the direct control voltages $U_{B1}$ and $U_{B2}$ is fed to the respective mixer stage via a delta resistor circuit 24. Two of the corners of delta circuit 24 are connected to respective connection points between mixer diodes D1 and D2 and the direct voltage separating capacitors C1 and C2. The third corner of the delta circuit 24 receives the direct control voltage $U_{B1}$ or $U_{B2}$. Radio frequency RF is obtained at the center tap of the secondary winding of transformer TR. High barrier silicon Schottky diodes are preferably used as mixer diodes D1 and D2. For each push-pull mixer stage, one diode is biased in the forward direction until there is a current flow from 0 to a maximum of 3mA.

During matching, the relationship between the five-bit word for the frequency information from the oscillator and the eight-bit word for the actuation of the D/A converter must be determined for every channel (oscillator frequency LO) employed. For this purpose, the carrier suppression must be measured for each channel. For matching, the PROMs S1 and S2 are initially removed from the control circuit for each mixer stage. By applying all 256 possible input combinations to the two D/A converters DA1 and DA2, the output voltage of the operational amplifier can be set in 256 increments from $+3$ V to $-3$ V. A spectrum analyzer is used to observe at which two input combinations of the D/A converters carrier suppression becomes optimum. These values are stored together with the associated frequency information. After all channels have been measured in this way, the PROMs S1 and S2 can be programmed with the stored information. For example, all 256 input combinations can be set by actuating the D/A converter by means of a 10-turn potentiometer. After programming the PROMs S1 and S2, the latter are placed into the control circuit. Thus the direct control voltage required for each preselectable frequency is set.

It will be understood that the above description of the present invention is susceptable to various modifications, changes and adaptations, and the same are intended to be comprehended within the meaning and range of equivalence of the appended claims.

What is claimed is:

1. A diode mixer arrangement comprising:
  a mixer stage connected for receiving a signal having a frequency to be converted and an oscillator signal having one of a plurality of preselectable oscillator frequencies, said mixer stage including diodes arranged to be biased by a predetermined direct control voltage for the compensation of parasitic influences: and
  bias voltage means connected to said mixer stage for producing the predetermined direct control voltage, said bias voltage means including a memory means for storing a plurality of data signals each of which represents a predetermined direct control voltage corresponding to a respective one of the plurality of preselectable oscillator frequencies, said memory means having an input for receiving an input signal which represents the preselectable oscillator frequency of the oscillator signal received by said mixer stage and output means for reading out the corresponding data signal, wherein said bias voltage means uses such corresponding data signal to generate the predetermined direct control voltage.

2. An arrangement according to claim 1, and further including:

a frequency synthesizer connected to said mixer stage for generating the oscillator signal at one of the preselectable oscillator frequencies and feeding the oscillator signal at a selected one of such frequencies to said mixer stage, said synthesizer comprising further memory means having an output connected to said memory means and being constructed for presenting a digital word to said memory means which corresponds to the preselectable oscillator frequency of the oscillator signal fed to said mixer stage;

wherein said bias voltage means further includes:

a digital to analog converter having input means connected to the output means of said memory means, and an output, said digital to analog converter producing an analog value corresponding to the data signal read out of said memory means; and a controllable bipolar voltage source connected to the output of said digital to analog converter for producing a voltage which corresponds to the analog value of said digital to analog converter and which is used as the predetermined direct control voltage for biasing the diodes of said mixer stage.

3. An arrangement according to claim 1, wherein said memory means comprises one of PROMs and E-PROMs.

4. An arrangement according to claim 1, wherein said controllable bipolar voltage source comprises an operational amplifier.

5. The arrangement according to claim 1 wherein said signal having a frequency to be converted is a single sideband signal and said mixer stage comprises a push-pull single sideband up-converter.

* * * * *

UNITED STATES PATENT AND TRADEMARK OFFICE
CERTIFICATE OF CORRECTION

PATENT NO. : 4,593,411
DATED : June 3rd, 1986
INVENTOR(S) : Wolfgang Schiller

It is certified that error appears in the above-identified patent and that said Letters Patent is hereby corrected as shown below:

In the heading of the patent, please insert --[73] Assignee: ANT Nachrichtentechnik GmbH, Backnang, FEDERAL REPUBLIC OF GERMANY.--.

Signed and Sealed this

Twenty-fifth Day of November, 1986

*Attest:*

DONALD J. QUIGG

*Attesting Officer*    *Commissioner of Patents and Trademarks*